United States Patent [19]

Yamaga et al.

[11] Patent Number: 5,614,447

[45] Date of Patent: *Mar. 25, 1997

[54] METHOD FOR HEAT-TREATING A SEMICONDUCTOR BODY

[75] Inventors: Shigeki Yamaga; Chikao Kimura, both of Kamifukuoka, Japan

[73] Assignee: New Japan Radio Co., Ltd., Tokyo-to, Japan

[ * ] Notice: The term of this patent shall not extend beyond the expiration date of Pat. No. 5,494,861.

[21] Appl. No.: 559,091

[22] Filed: Nov. 16, 1995

[30] Foreign Application Priority Data

Nov. 30, 1994 [JP] Japan .................................. 6-321485
Jun. 30, 1995 [JP] Japan .................................. 7-187886

[51] Int. Cl.⁶ .................................. H01L 21/324
[52] U.S. Cl. .................................. 437/247; 148/DIG. 113
[58] Field of Search .................................. 437/247, 174, 437/934, 248, 987; 148/DIG. 113, DIG. 3

[56] References Cited

U.S. PATENT DOCUMENTS

| | | | |
|---|---|---|---|
| 4,357,180 | 11/1982 | Molner | 437/247 |
| 4,571,486 | 2/1986 | Arai et al. | 437/247 |
| 4,820,651 | 4/1989 | Prince et al. | 437/247 |
| 4,830,983 | 5/1989 | Thornton | 437/162 |
| 4,830,987 | 5/1989 | Miller et al. | 437/247 |
| 4,978,007 | 12/1990 | Jacobs et al. | 206/469 |
| 5,093,284 | 3/1992 | Yoshida et al. | 437/247 |
| 5,219,798 | 6/1993 | Kamakura | 437/247 |
| 5,306,895 | 4/1994 | Ushikoshi et al. | 118/725 |
| 5,494,801 | 2/1996 | Yamaga et al. | 437/247 |

FOREIGN PATENT DOCUMENTS 55-56637  4/1980  Japan .................................. 437/247

*Primary Examiner*—John Niebling
*Assistant Examiner*—S. Mulpuri
*Attorney, Agent, or Firm*—Armstrong, Westerman, Hattori, McLeland & Naughton

[57] ABSTRACT

A method for heat-treating a semiconductor body comprising steps of: (a) disposing a susceptor on one surface of the semiconductor body, and disposing a protection plate in such a manner that the other surface of the semiconductor faces to a surface the protection plate, (b) heat-treating the semiconductor body, wherein the susceptor and the protection plate comprises at least one member selected from the group consisting of gallium nitride, aluminum nitride and boron nitride, and at least one of the susceptor and the protection plate has an absorber of infrared ray.

4 Claims, 4 Drawing Sheets

METHOD FOR HEAT-TREATING A SEMICONDUCTOR BODY

BACKGROUND OF THE INVENTION

The present invention relates to a method for heat-treating semiconductor substrates and epitaxial thin films, especially to a lamp anneal method using an infrared lamp.

When an impurity is introduced to a silicon substrate or the like by ion implantation and is utilized as a conduction carrier, a heat-treatment called "activation" is required for restoring crystal defects which arise on the ion implantation and for moving the introduced impurity atoms to desired lattice sites. This heat-treatment is conducted by a method called a lamp anneal method wherein a silicon substrate or the like is irradiated with infrared rays from an infrared lamp to raise the temperature of the substrate in a short time.

Conventionally, when a silicon substrate is heat-treated by the lamp anneal method, no special susceptor has been used. Without using a susceptor, there has been a problem that, when undergoing rapid heating and rapid cooling such as the lamp anneal method, a silicon substrate will produce a heat deformation such as a warp as well as a surface defect such as a microslip. Moreover, generally, a lamp anneal unit controls an output while monitoring the temperature of the semiconductor substrate with a pyrometer or the like. It is necessary to accurately grasp the emissivity of the surface of the substrate so as to monitor the temperature. However, in the manufacturing process of a silicon devices, various kinds of materials such as an oxide film, a nitride film, and a polysilicon film are formed on the front and back surface of silicon substrate, and have each different thickness so that it is difficult to accurately measure the temperature. Moreover, the silicon substrate has a weakness of having a low absorption rate of infrared rays.

On the other hand, it is necessary to use a susceptor in the heat-treatment of a compound semiconductor substrate by the lamp anneal method. A unit used in the heat-treatment on a compound semiconductor substrate has a structure where a susceptor is placed in a quartz tube, a compound semiconductor substrate is piled on the susceptor, and the infrared rays are irradiated vertically to the surface of the substrate. The irradiated infrared rays are mainly absorbed by the susceptor and the compound semiconductor substrate is heated by means of the heat conduction from the irradiated infrared rays.

Conventionally, a single-crystalline silicon substrate or a porous carbon, or the like have been used as a material for susceptor. Among them, the single-crystalline silicon substrate has superior characteristics of being chemically stable at a high temperature at least 1000° C. and of being capable of undergoing a process to provide a higher flatness. However, as mentioned above, it has a weakness of producing a heat deformation such as a warp when undergoing rapid heating and rapid cooling, and of producing a surface defect such as a microslip on the compound semiconductor substrate. Moreover, silicon has a weakness that it has an absorption band which scarcely overlaps the wavelength region of the infrared lamp as a heating source so that it has low heating efficiency. On the other hand, porous carbon is superior in absorbing the infrared rays in the wavelength region of the infrared lamp, however, it has a weakness that it has a high heat capacity not being suited for rapid heating and rapid cooling.

Moreover, a problem of evaporation arises by heat-treatment. That is to say, the heat-treatment evaporates a constituent element having a low evaporation temperature from the surface of a compound semiconductor substrate. For example, in the case of gallium arsenide substrate for a compound semiconductor substrate, arsenic evaporates, and said susceptor for a silicon single-crystalline substrate or the like absorbs the evaporated arsenic molecules so that the crystallinity of the compound semiconductor substrate degrades. Furthermore, there is a weakness that the flatness of the surface of gallium arsenide substrate degrades. Moreover, because of gallium remaining on the surface of the gallium arsenide substrate after arsenic has evaporated, a problem arises that the characteristics of the electronic device fluctuates, thereby making it impossible to use gallium arsenide as a susceptor.

In order to solve above-mentioned weaknesses, there is proposed a method in which a flat plate member containing at least one compound selected from the group consisting of gallium nitride, aluminum nitride, and boron nitride, each of compounds having superior characteristics as a material for a susceptor, is heat-treated, the flat plate member facing to the surface of the semiconductor substrate to be treated (Japanese Patent Application No. 5-21490). Especially, since a sintered body is not almost deformed by heat cycles, by using the sintered body of above materials as a susceptor, a stable annealing can be achieved.

However, there has been found that the absorption rate of the infrared rays may be decreased under some conditions of forming a sintered body even in the case of a sintered body with relatively high absorption efficiency of infrared rays. Hereinafter, as an example of the present invention, two kinds of aluminum nitride sintered bodies are explained. These two kinds of sintered bodies have different binder materials at the time of formation. As shown in Table 1, it is found that the sintered body A and the sintered body B have substantially different absorption coefficients. These infrared absorption coefficient are calculated from the results of the measurement of the linear transmission factor of the infrared rays with wavelength of 6 micron by means of an FT-IR method.

TABLE 1

|  | Infrared adsorption coefficient $(cm^{-1})$ | Thermal conductivity $(W/m \cdot K)$ |
| --- | --- | --- |
| Sintered body A | 92 | 140 |
| Sintered body B | 39 | 170 |

When the heat-treatment is conducted by using a susceptor with two different infrared absorption coefficients as such, sufficiently favorable heat-treatment characteristics can be obtained in comparison with the case of using a single-crystalline silicon substrate or the like as a susceptor. However, there has been a problem that the temperature-rise profile varies with each susceptor even though the strength of the rays which are irradiated from the infrared lamp, so that the characteristics of the semiconductor substrate to be treated will vary. Moreover, there was a problem that it is very difficult to match the temperature-rise profiles of the susceptors each of which has different infrared absorption coefficients to each other.

On the other hand, each of sintered body A and sintered body B has a sufficiently large value of heat conductivity as a susceptor to be used in the lamp anneal method wherein rapid heating and rapid cooling are conducted. Such a property is common among the group of sintered bodies, that is, gallium nitride and boron nitride, not necessarily limited

3 to the sintered body of aluminum nitride. Namely, it will be best suited for the susceptor for the lamp anneal method if it is possible to obtain a flat member which is a flat member containing at least one member selected from the group consisting of gallium nitride, aluminum nitride, boron nitride, if each of these members is a sintered body or a compound and if each of these members is able to have a large and constant infrared absorption coefficient in favorable reproducibility.

This invention has a purpose to solve a problem that the conventionally provided material as a susceptor to be used in the heat-treatment of a semiconductor substrate with the lamp anneal method has low infrared absorption coefficient and to provide a most-suitable material for the susceptor.

SUMMARY OF THE INVENTION

According to one aspect of the present invention, there is provided a method for heat-treating a semiconductor body comprising steps of:

(a) disposing a susceptor on one surface of the semiconductor body, and disposing a protection plate in such a manner that the other surface of the semiconductor body faces to a surface of the protection plate, (b) heat-treating the semiconductor body, wherein the susceptor and the protection plate comprises at least one member selected from the group consisting of gallium nitride, aluminium nitride and boron nitride, rand at least one of the susceptor and the protection plate has an absorber of infrared ray.

According to another aspect of the present invention, there is provided a method for heat-treating a semiconductor body comprising steps of:

(a) disposing a susceptor and a protection plate as to cover a whole surfaces of the semiconductor body, and (b) heat-treating the semiconductor body, wherein the susceptor and the protection plate consisting at least one selected from the group consisting of gallium nitride, aluminium nitride and boron nitride, and at least one of the susceptor and the protection plate has an absorber of infrared ray.

In the method of the present invention, at least one of the susceptor and the protection plate is coated with the absorber.

In the method of the present invention, the absorber is provided inside both the susceptor and the protection plate.

In the present invention, the semiconductor body may be a semiconductor substrate, a semiconductor substrate with epitaxial films, or the like.

DETAILED DESCRIPTION

Figure 1:
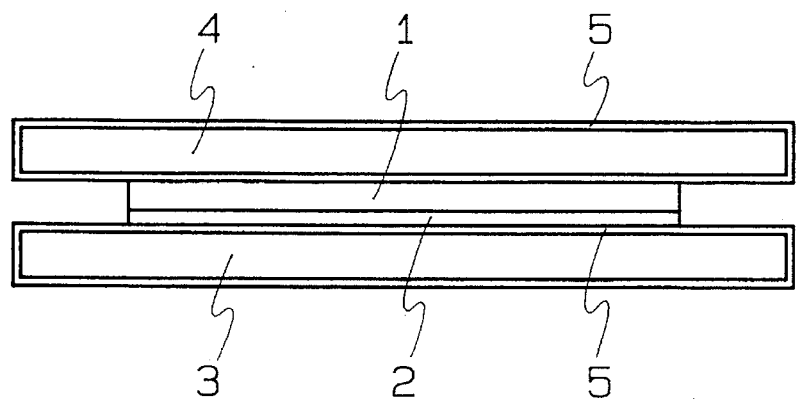
FIG. 1 is an illustrative view of the susceptor in the first embodiment of the present invention.

FIG. 1 shows a condition where a surface of the semiconductor body is faced to a susceptor according to the first embodiment of the heat-treatment method of the present invention. In FIG. 1, reference numeral 1 indicates a semiconductor substrate such as a compound semiconductor such as gallium arsenide, or semiconductor substrate such as silicon, reference numeral 2 indicates an impurity implantation region where impurities are implanted on the surface of the semiconductor substrate 1 by ion implantation method, reference numeral 3 indicates a susceptor consisting of at least one member selected from the group consisting of gallium nitride, aluminium nitride, and boron nitride, reference numeral 4 indicates a protection plate consisting of at least one member selected from the group consisting of gallium nitride, aluminium nitride, boron nitride, and reference numeral 5 indicates an absorbing-film for an infrared ray, the absorbing-film comprising either a carbon film or a film containing carbon, the absorbing-film being coated on the surface of the susceptor 3 and the protection plate 4. The impurity implantation region 2 on the surface of the semiconductor substrate 1 is closely contacted on the susceptor 3 or faced to the susceptor 3 in parallel with a very small space in order to conduct the heat-treatment using a lamp anneal unit equipped with an infrared lamp (not indicated in FIG. 3) as a heating source. The surface of the susceptor 3 is flattened so that the surface of the susceptor can be closely contacted with the substrate 1 or can be faced with the substrate with very small space being kept in parallel with the surface of the semiconductor substrate 1. The dimension between the semiconductor substrate 1 and the protection plate 4 in FIG. 1 is shown broader than the real example so as to indicate the configuration clearly. The protection plate 4 should preferably be closely contacted with the substrate 1 or should be faced with the substrate and a very small space being kept.

Figure 2:
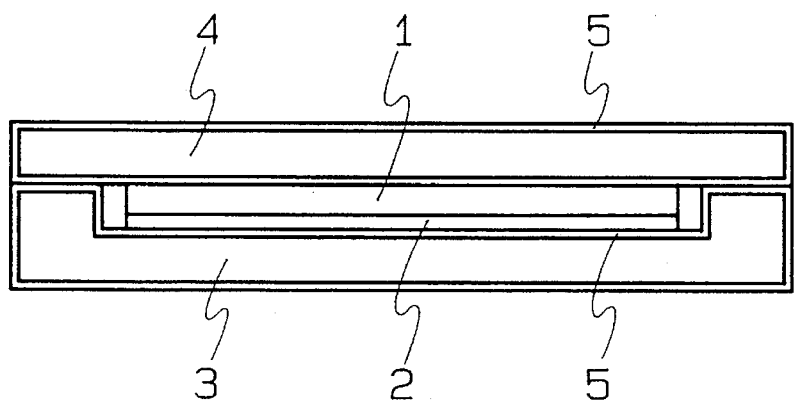
FIG. 2 is a sectional view of the susceptor in the second embodiment of the present invention.

FIG. 2 shows the second embodiment of the present invention. As shown in FIG. 2, a convex is formed in a position facing the side section of the semiconductor substrate 1 so that the side section of the semiconductor substrate 1 is covered. Moreover, in this case, it is possible to form the susceptor 3 as a flat plate and form the convex on the protection plate 4 by reversing the shape of the susceptor 3 and the protection plate 4. In this case, the height of the convex is made the same as the thickness of the semiconductor substrate 1 or slightly higher than that to allow a configuration where the convexed shape of the susceptor 3 closely contacts with the protection plate 4 and covers whole surfaces of the semiconductor substrate 1. Moreover, the convex is made slightly lower than the thickness of the semiconductor substrate 1 so as to allow the semiconductor substrate 1 to contact closely with the protection plate 4.

Figure 3:
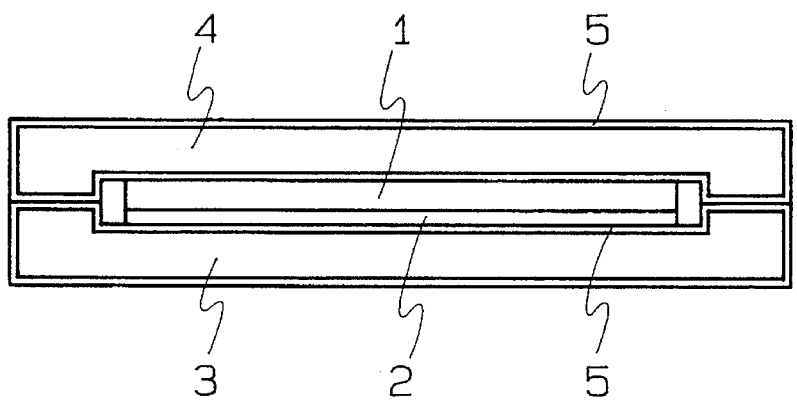
FIG. 3 is a sectional view of the susceptor in the third embodiment of the present invention.

Furthermore, FIG. 3 shows the third embodiment of the present invention. As shown in FIG. 3, it is also possible to form convexes on both the susceptor 3 and the protection plate 4 to closely contact the convexes on the susceptor 3 and the protection plate 4 so as to cover the side section of the semiconductor substrate 1.

Figure 4:
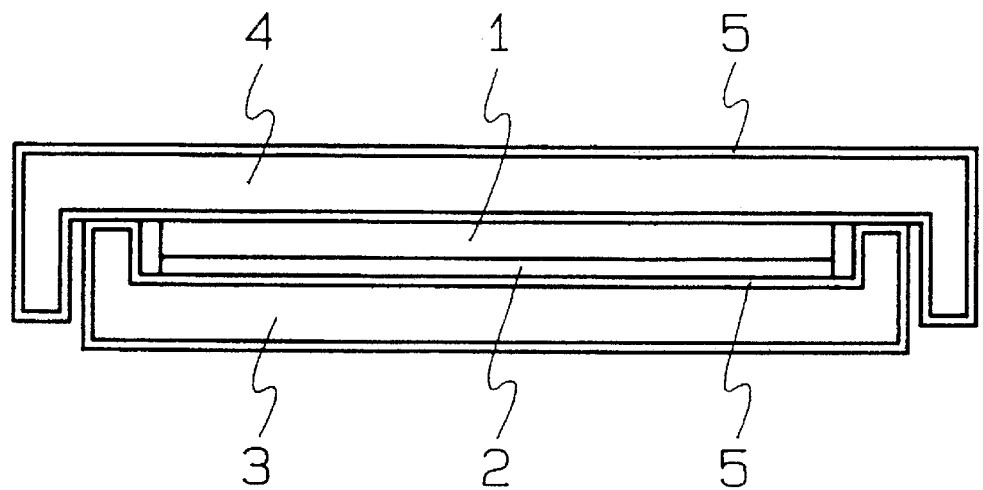
FIG. 4 is a sectional view of the susceptor in the fourth embodiment of the present invention.
Figure 5:
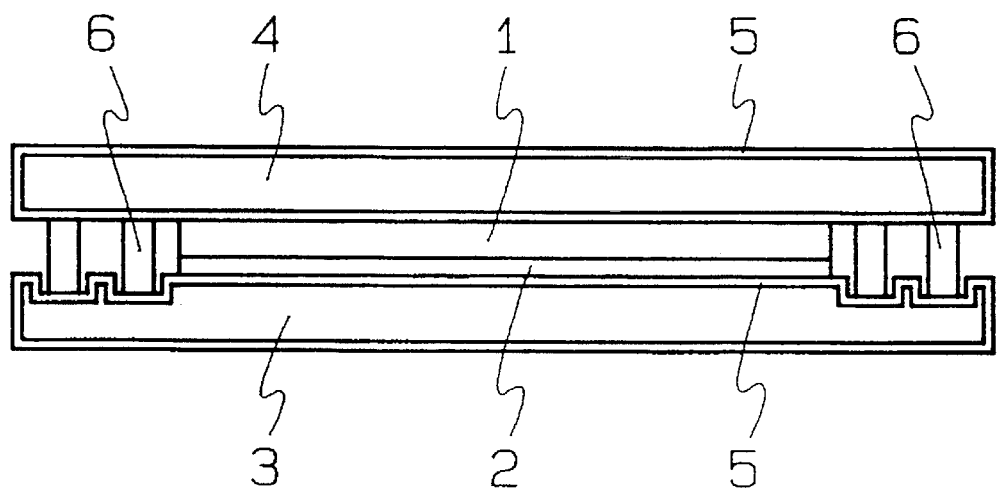
FIG. 5 is a sectional view of the susceptor in the fifth embodiment of the present invention.

FIG. 4 shows the fourth embodiment of the present invention. As shown in FIG. 4, a convex is formed on both the susceptor 3 and the protection plate 4. By making the of the convex on the susceptor 3 the same as the thickness of the semiconductor substrate 1 or slightly higher than the thickness of the semiconductor substrate so that the susceptor 3 is allowed to contact closely with the protection plate 4, and to cover the whole surface of the semiconductor substrate 1. Moreover, as described above, by making the height lower, it is possible to contact the semiconductor substrate 1 closely with the protection plate 4. FIG. 5 shows the fifth embodiment of the present invention. In this embodiment, a side wall member comprising of a ring or the like (matched with the shape of the semiconductor substrate) is combined with the flat-plate-shaped susceptor 3 and the protection plate 4 so that the side wall member faces to the side section of the semiconductor substrate 1. In this case, as shown in FIG. 5, it is possible to realize more uniform heating with less heat radiation from the side section of the semiconductor substrate 1 by providing a space between the side wall members 6, which comprises two rings with different diameters from each other. It is also possible to select properly the height of the side wall member 6 in relation to the thickness of the semiconductor substrate 1. Also the side wall members are not restricted to two rings, a ring or a divided member may be used. The shape of the side wall member is not restricted only to a circle, but polygonal shape may be used. Moreover, a groove is provided on the susceptor 3 to fix the position of the ring or the like, however, the groove is not necessarily required.

Moreover, the dimension between the side section of the semiconductor substrate 1 and convex shaped susceptor or protection plate, or the side wall member described in the embodiments 2 through 5 is set properly by taking the thermal expansion coefficient of the semiconductor substrate or susceptor or the like at the time of heating into consideration. The dimension may preferably be determined in such a manner that the side wall member 6 or the susceptor 3 having the convex or the protection plate 4 is allowed to contact or to face with very small space being kept at the time of heating.

The lamp anneal unit is generally equipped with a plurality of infrared lamps, so that a difference in temperature appears on the surface of the material to be heated due to the difference in the strength of each lamp or to the state of lapping of the direct light reaching the material to be heated. However, according to the method of heat-treatment in the present invention, both the susceptor 3 and the protection plate 4 absorb the infrared rays irradiated from the infrared lamp once, and in turn heat the semiconductor substrate 1 by irradiated heat so as to make it possible to mitigate this difference in temperature. Moreover, each member comprising a material with large heat conductivity, respectively the susceptor 3 and the protection plate 4 or the side wall member 6, are uniformly heated as a whole. This can be considered approximately to be a black body furnace. The whole surface of the material to be heated is covered with this approximated black furnace and heated, thereby making it possible to obtain effects of the uniform heating.

The whole surface of the susceptor 3 and the protection plate 4 is coated with a carbon film or the infrared absorbing-film 5 comprising a film containing carbon by means of a CVD method using a hydrocarbon such as methane so as to effectively absorb the light having wavelength the band of an infrared lamp. As an absorbing-film 5, other than the carbon film or the like, it is possible to coat silicon carbide which is stable in high temperature, or to coat metal which does not show deformation such as melting in heat-treatment temperature, for example, tantalum carbide, tungsten carbide, molybdenum carbides, these carbide being a carbide made of high melting point metal such as tantalum, tungsten, molybdenum, tantalum boride, tungsten boride, and molybdenum borides these boride being a boride made of above-mentioned metals, in a such state that the surface is porous and that the surface does not produce reflection of the irradiated infrared rays. Here, if there is a possibility that the surface of the semiconductor substrate 1 to be treated may be contaminated with such metals when a metal is used for an absorbing-film, it is possible to form other coating film, for example, a nitride film, an oxide film, a poly-crystalline silicon film or the like on the absorbing-film 5. The nitride film, the oxide film, and the poly-crystalline silicon film can transmit infrared rays to allow the absorbing-film such as carbon film to efficiently absorb the infrared rays. The infrared rays absorbed in this carbon film heat the susceptor 3 and the protection plate 4, resulting in heating the semiconductor substrate 1 with that radiation heat. Here, the thickness of the coating of the absorbing-film 5 can have such a sufficient thickness that the absorbing-film 5 absorb the irradiated infrared rays. For example, in the case of the carbon film coated by means of CVD method, 5000 angstrom thickness is sufficient.

In the previous description, a structure where the whole surfaces of the susceptor 3 and protection plate 4 are coated with an absorbing-film 5. However, it is possible to coat the one side or both sides of the surface irradiated with the infrared ray or other side surface of the surface irradiated with the infrared rays or coat one or both surface contacting with the impurity implantation region 2 on the surface of the semiconductor substrate 1 or the surface contacting with the rear side of the semiconductor substrate 1. Moreover, it is possible to combine them. In view of enhancing the heating efficiency, it is desirable that the absorbing-film 5 is at least coated on the surface on the side of the susceptor 3 and the protection plate 4 on which the impurity implantation region 2 on the surface of the semiconductor substrate 1 is closely contacted or faced with very small space, and where the infrared rays are irradiated. Taking the thermal expansion coefficient into consideration, it is desirable that the susceptor 3 and protection plate 4 are made of the same material, however, it is not necessarily to be the same.

According to the present invention, the susceptor comprises material having lower heat capacity, higher heat conductivity, and higher infrared absorption coefficient than the conventional material allows the rapid heating and rapid cooling even if the material of the susceptor is used for the heat-treatment of a silicon substrate being not restricted to a compound semiconductor substrate as a semiconductor substrate to be heat-treated, in comparison with the case where no conventional susceptor is used. More than that, a pyrometer measures the temperature of the susceptor having always a constant emissivity, thereby allowing highly accurate temperature control. Especially, when using the susceptor with structure shown in FIG. 2 though FIG. 5, it is possible to heat the whole silicon substrate uniformly, thereby making it possible to completely prevent surface defects such as a microslip.

Figure 6A:
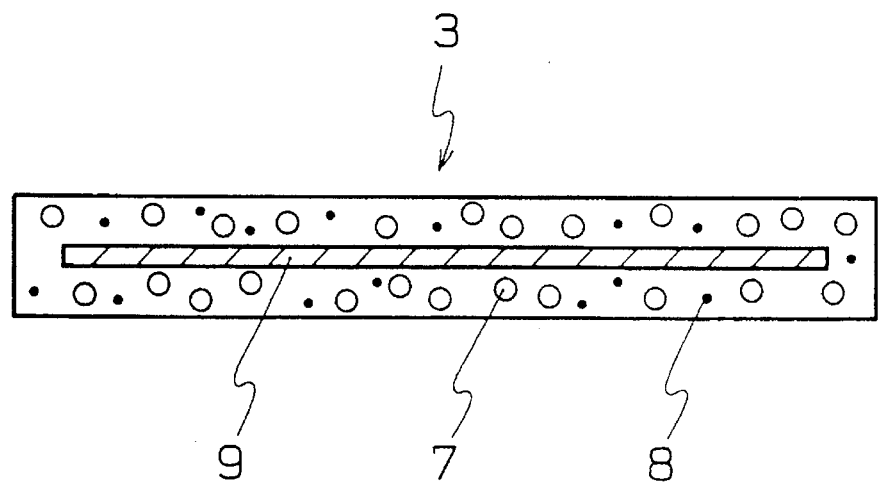
FIG. 6 is a sectional view of the susceptor in the sixth embodiment of the present invention.
Figure 6B:
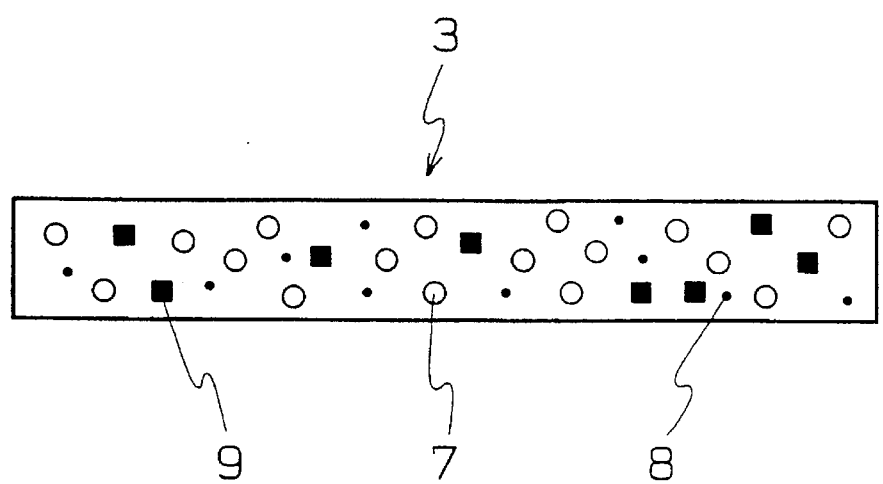

Next, FIG. 6 shows the sixth embodiment of the present invention. The sixth embodiment is, especially, a case where a susceptor and a protection plate are formed with sintered bodies. The shape of the susceptor and the protection plate is the same shape as shape shown in FIG. 1 through FIG. 5 where the absorber is provided inside the susceptor and the protection plate instead of coating the surface with the absorbing-film 5. FIG. 6 shows the structure of contained absorber taking the case of the susceptor 3 with the structure in FIG. 6(a) as an example. In FIGS. 6(a) and 6(b), reference numeral 7 indicates a raw material particle of a sintered body consisting of gallium nitride, aluminum nitride, and boron nitride, reference numeral 8 indicates binder, and reference numeral 9 indicates absorber. FIG. 6(a) shows a structure where a sintered body of gallium nitride, or the like is formed so as to surround the plate-shaped absorption body 9. A carbon plate or other sintered body can be also used for the plate-shaped absorber 9. The configuration structure of the susceptor 3 can be dual layer structure or multi-layer structure where sintered body such as gallium nitride, is formed on the absorber 8. FIG. 6(b) shows a structure where powder-shaped absorber 9 such as carbon is simultaneously added with binder 7 such as yttrium oxide at the time of forming the sintered body. In such susceptor the 3, the absorber absorbs the infrared ray, even if the gallium nitride itself does not absorb the infrared ray and the temperature of the susceptor increases. The protection plate is formed similarly. Forming the absorber in such a way makes it possible to omit the coating process for forming said absorbing-film, thereby making it possible to form the susceptor and the protection plate more simply. Here, the thickness of the absorber 9 shown in FIG. 6(a), and the content ratio of the absorber 9 shown in FIG. 6(b) are determined properly so that the infrared ray absorption coefficient of the sintered body is sufficiently large and the strength of the susceptor is maintained in accordance with the size of the particles of the raw material for the sintered body, and kinds of the binder, and content quantity or the like. In FIG. 6(b) as an example, the content ratio of the absorber is approximately 1% with respect to the weight of total raw material of the sintered body. Moreover, there is a case where the binder serves as an absorber.

In the sixth embodiment as described above, it is desirable that the susceptor and the protection plate are made of the same material with the expansion coefficient taken into consideration. However, it is not necessarily be identical. The susceptor and the protection plate formed in the method of the present invention can enhance the absorption rate of the infrared rays while maintaining the lower heat capacity and higher heat conductivity that are the characteristics of the gallium nitride, aluminum nitride, boron nitride. Since the results of the heat-treatment of the semiconductor body, they have less heat deformation in comparison with the conventional susceptor and prevent defects such as microslip, with favorable results. Moreover, these materials do not provide an absorber for the arsenic so that it does not cause degradation of the flatness of the surface of the semiconductor body due to the evaporation of the arsenic even if the semiconductor body to be treated is made of a compound semiconductor containing arsenic as a constituent element.

Figure 7:
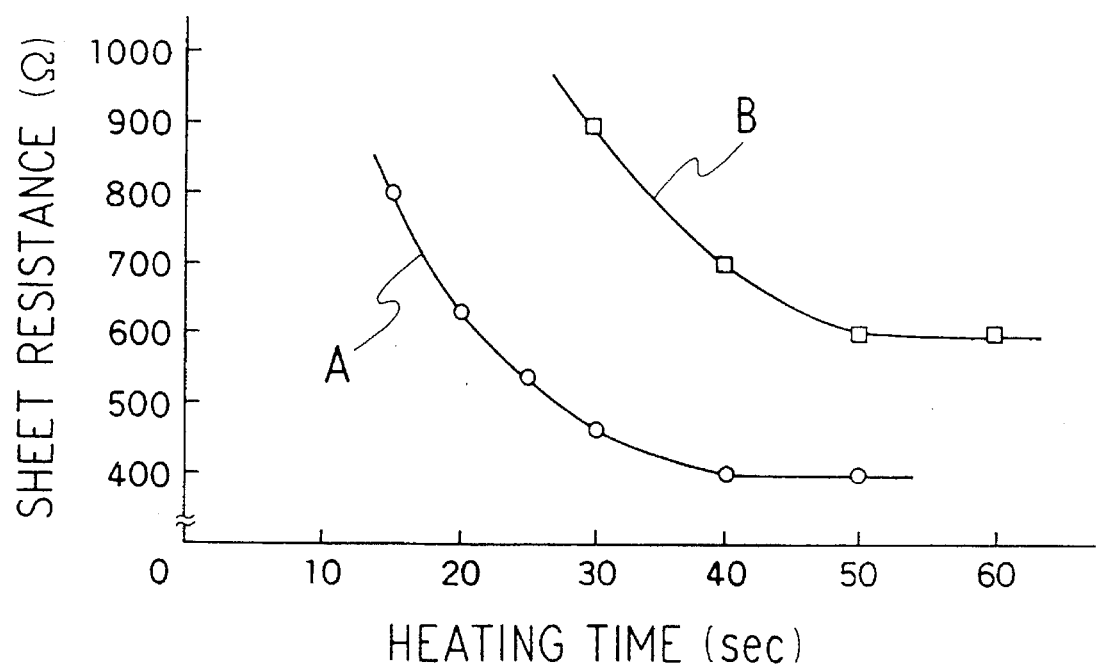
FIG. 7 is an illustrative view for showing the heat-treatment characteristics in the case of using the susceptor in one embodiment of the present invention.

FIG. 7 shows the results of the heat-treating and measuring the sheet resistance using the susceptor and the protection plate formed as mentioned above. For comparison, two kinds of sintered bodies of aluminum nitride with different absorption coefficient of infrared ray are used. Sintered bodies of aluminum nitride having an absorber inside with the structure shown in FIG. 6(b) are used for the susceptor and the protection plate. A gallium arsenide substrate is used for the semiconductor substrate to be treated. After silicon ions are implanted on the surface of the substrate, under the conditions of the accelerating energy being 82 KeV, quantity of does being $5.2 \times 10^{12}/cm^2$, magnesium ions are ion-implanted under the conditions of accelerating energy being 170 KeV, quantity of dose being $3.75 \times 10^{11}/cm^2$, after the heat-treatment of 950° C., the result of measuring sheet resistance with the eddy current method is shown in FIG. 7.

In FIG. 7, the straight line A indicates the case where a sintered body of aluminum nitride containing an absorber for infrared rays, and the straight line B indicates the case where the aluminum nitride without containing an absorber for the infrared rays.

As shown in FIG. 7, it is clear that the sheet resistance decreases in the case where the susceptor contains the absorber for infrared ray. Moreover, the sheet resistance decreases faster than the one without the absorber inside in a short time. The result that the sheet resistance decreases is explained in such a way that the sintered body of aluminum nitride containing the absorber for the infrared ray is capable of being rapidly heated and rapidly cooled, thereby realizing the efficient heat-treatment in a short time with enhanced activation rate. Moreover, observing the surface of the heat-treated gallium arsenide substrate, there was no degradation of flatness of the surface due to the evaporation of arsenic and no formation of straight line-shaped defects such as a microslip. A sintered body containing an absorber body for the infrared ray has a tendency to have a larger activation rate. Such tendency is also observed in the sintered body of gallium nitride and boron nitride, not restricted to the sintered body of aluminum nitride. Moreover, in the first though fifth embodiments, since the absorbing-film 5 such as a carbon film or the like is coated on the protection plate 4, the same effect is obtained. On the other hand, after heat-treating the silicon substrate instead of heat-treating the gallium arsenide substrate, in the result of measuring, the sheet resistance of the silicon substrate was not better than the sheet resistance of the gallium arsenide substrate. When observing the surface of the silicon substrate, less numbers of surface defects such as microslip were observed, in comparison with observing the gallium arsenide substrate.

As described above, according to the present invention, the material which has lower heat capacity, higher heat conductivity and higher infrared absorption coefficient was provided as a holding stand when undergoing rapid heating and rapid cooling such as a lamp anneal method. Using such susceptor for heat-treatment allows to prevent formation of straight line-shaped defects such as a microslip. In particular, when a compound semiconductor substrate is used as a semiconductor substrate, since the materials for the susceptor do not absorb the elements evaporated from the surface of the semiconductor body, which could realize high efficiency of activation and stable reproducibility was obtained in case of annealing for activating impurities by means of the ion implantation method. Using the heat-treated semiconductor body for manufacturing electronic devices such as FETs, ICs or the like allows high performance and high production yield of the devices was obtained.

Though several embodiments of the present invention are described above, it is to be understood that the present invention is not limited only to the above-mentioned, various changes and modifications may be made in the invention without departing from the spirit and scope thereof.

What is claimed is:

1. A method for heat-treating a semiconductor body with an impurity implanted region comprising steps of:
 (a) disposing a susceptor on one surface of the semiconductor body with an impurity implanted region, and disposing a protection plate in such a manner that the other surface of the semiconductor body faces to a surface of the protection plate,
 (b) heat-treating the semiconductor body to activate the impurity implanted region,
 wherein the susceptor and the protection plate comprises at least one member selected from the group consisting of gallium nitride, aluminium nitride and boron nitride, and at least one of the susceptor and the protection plate has a coating of an absorber of infrared ray.

2. A method for heat-treating a semiconductor body with an impurity implanted region comprising steps of:

(a) disposing a susceptor and a protection plate as to cover a whole surface of the semiconductor body with an impurity implanted region, (b) heat-treating the semiconductor body to activate the impurity implanted region, wherein the susceptor and the protection plate consisting of at least one selected from the group consisting of gallium nitride, aluminium nitride and boron nitride, and at least one of the susceptor and the protection plate has a coating of an absorber of infrared ray.

3. A method for heat-treating a semiconductor body with an impurity implanted region comprising steps of:

(a) disposing a susceptor on one surface of the semiconductor body with an impurity implanted region, and disposing a protection plate in such a manner that the other surface of the semiconductor body faces to a surface of the protection plate, (b) heat-treating the semiconductor body to activate the impurity implanted region, wherein the susceptor and the protection plate comprises at least one member selected from the group consisting of gallium nitride, aluminium nitride and boron nitride, and an absorber of infrared ray is provided inside both the susceptor and the protection plate.

4. A method for heat-treating a semiconductor body with an impurity implanted region comprising steps of:

(a) disposing a susceptor and a protection plate as to cover a whole surface of the semiconductor body with an impurity implanted region, (b) heat-treating the semiconductor body to activate the impurity implanted region, wherein the susceptor and the protection plate consisting of at least one selected from the group consisting of gallium nitride, aluminium nitride and boron nitride, and an absorber of infrared ray is provided inside both the susceptor and the protection plate.

* * * * *